(12) United States Patent
Chen (10) Patent No.: US 11,121,056 B2
(45) Date of Patent: Sep. 14, 2021

(54) SEMICONDUCTOR DEVICE AND MANUFACTURING METHOD OF THE SAME

(71) Applicant: TAIWAN SEMICONDUCTOR MANUFACTURING COMPANY LTD., Hsinchu (TW)

(72) Inventor: Chien-Mao Chen, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 67 days.

(21) Appl. No.: 16/258,631

(22) Filed: Jan. 27, 2019

(65) Prior Publication Data

US 2020/0243416 A1 Jul. 30, 2020

(51) Int. Cl.
*H01L 23/40* (2006.01)
*H01L 21/66* (2006.01)
*H01L 23/00* (2006.01)

(52) U.S. Cl.
CPC .......... *H01L 23/4012* (2013.01); *H01L 22/30* (2013.01); *H01L 24/42* (2013.01)

(58) Field of Classification Search
CPC ..... H01L 22/34; H01L 22/30; H01L 23/4012; H01L 24/42; G01R 31/2851; G01R 31/2884
See application file for complete search history.

(56) References Cited

U.S. PATENT DOCUMENTS

2011/0284843 A1* 11/2011 Chen .............. H01L 22/34
257/48
2019/0221535 A1* 7/2019 Shin ............... H01L 23/535

\* cited by examiner

*Primary Examiner* — Marcos D. Pizarro
*Assistant Examiner* — Antonio B Crite
(74) *Attorney, Agent, or Firm* — WPAT, P.C.; Anthony King (57) ABSTRACT

A semiconductor device includes a semiconductive substrate, a dielectric stack disposed over the semiconductive substrate, a probe pad formed on the dielectric stack, a test key embedded in the semiconductor device and a single via string stacking extending along a direction from a level of the probe pad to the semiconductive substrate and electrically connecting the periphery of the probe pad to the test key. A semiconductor device includes a semiconductive substrate, a dielectric stack, a probe pad, a test key, an extension segment electrically connected to the periphery of the probe pad and laterally extending from the probe pad from a top view, and a single via string stacking extending along a direction from the probe pad to the semiconductive substrate and electrically connecting the extension segment to the test key. The single via string stacking and the probe pad are laterally offset from a top view.

20 Claims, 8 Drawing Sheets

SEMICONDUCTOR DEVICE AND MANUFACTURING METHOD OF THE SAME

BACKGROUND

Wafers are used as carriers for fabrication during the production of integrated circuits (ICs). After semiconductor fabrication processes, a plurality of dies are formed on a wafer, and the integrated circuit devices (or IC dies) are typically tested at the wafer level before singulation. These dies are later separated through a die cutting or singulation process in which typically a mechanical or laser saw is used to cut through the wafer between individual chips or dies. A test line area comprises the areas of the wafer that are not utilized or occupied by the dies.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The manufacturing flow of an integrated circuit can be mainly divided into the following stages: the manufacturing of the semiconductor wafer, the fabrication of the integrated circuit on the semiconductor wafer, and the cutting, electrical testing, sorting, and packaging of the integrated circuit. When fabricating the integrated circuit on the semiconductor wafer, the entire semiconductive substrate is divided uniformly into many identical dies, and the adjacent dies are separated by scribe lines.

To facilitate wafer-level testing before the die cutting process, a wafer-testing method called a wafer acceptance test (WAT) method is typically employed. The wafer acceptance test can measure defects of the wafer and confirm the expected service life of the semiconductor device. Prior to the wafer acceptance test, some test line structures (i.e., test keys and test pads), which are electrically connected to the wafer, are formed between the scribe lines around a die. The test line structures are electrically connected to an external circuit or probes of a probe card via the test pads to check the quality of the integrated circuit, as part of the wafer acceptance test. A device similar to a device formed in a die is also formed between the scribe lines as a part of the test line structure.

Figure 1:
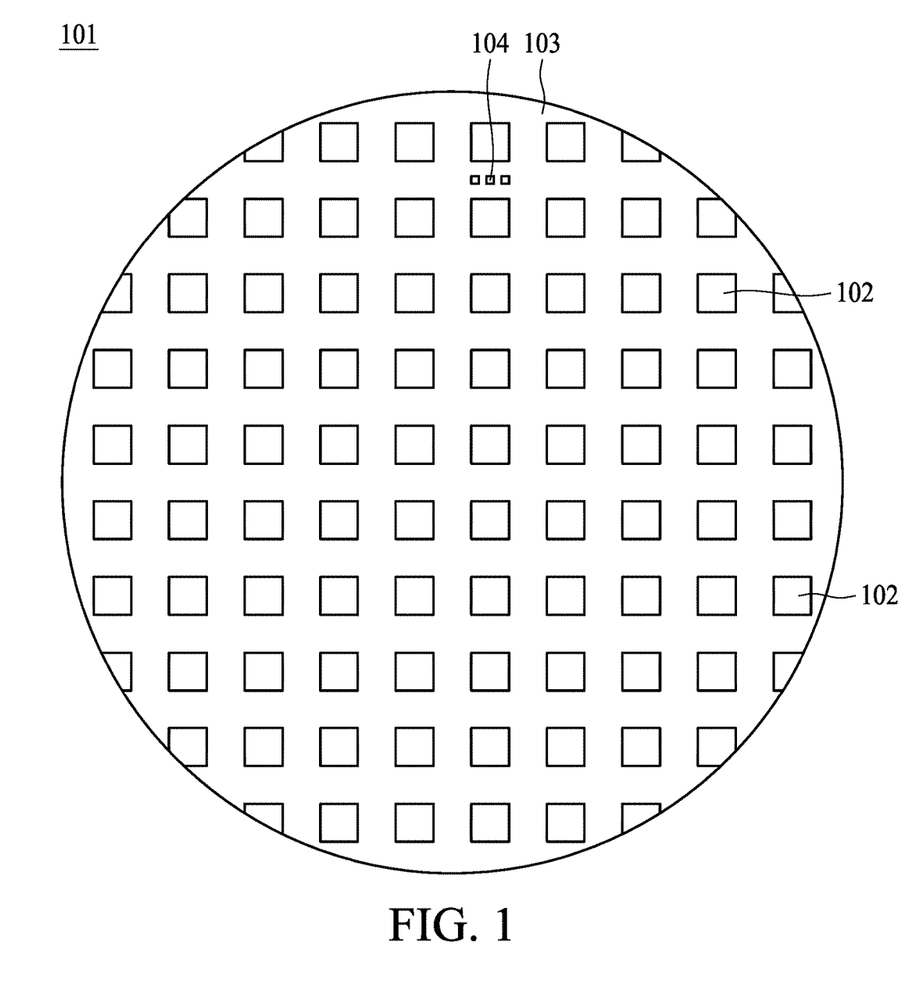
FIG. 1 is a schematic top view of a conventional wafer.

FIG. 1 is a top view of a conventional wafer 101, schematically illustrating a typical structure of a wafer. Integrated circuits (ICs) are generally fabricated in an array on or in a semiconductive substrate. As illustrated in FIG. 1, several dies 102 are formed on a wafer 101 with a matrix distribution. A plurality of test lines 103 are formed between dies 102. In each of the dies 102, an actual device, including, for example, metal-oxide semiconductor (MOS) transistors, capacitors, and interconnects, is formed. During semiconductor fabrication, processes are performed on the entire wafer 101 so that several testing circuits, each of which is similar to the actual device in each of the dies 102, are simultaneously formed in the test line area 103. The testing circuits are electrically coupled to an external read out circuit through several probe pads 104. In a sectional perspective, the wafer 101 generally includes several layers formed over a substrate. One or more of the layers may be cut along scribe lines using a mechanical saw or a laser saw. After scribing, the substrate may be cut to separate the dies from one another by conventional mechanical or laser cutting methods.

Since the development of the integrated circuit, the semiconductor industry has experienced a continuous scaling down of device feature sizes and a continuous increasing of IC circuit complexity in order to meet the increasing demand for integration of more complex circuit functions on a single chip. A similar trend has been urged upon the size and design of test line structures. In response to such demands, the area of a test line structure must be reduced with each technology generation to facilitate greater wafer area holding functional integrated circuitries.

To facilitate further improvements, semiconductor manufacturers use materials that reduce the capacitance of dielectric layers. For example, to form a finer circuit pattern, a semiconductor wafer having a low dielectric constant (low-k) insulating film is laminated on the surface of the semiconductive substrate. Low-k dielectrics may include, for example, an inorganic material such as SiOF or SiOB, or an organic material such as a polyimide-based or parylene-based polymer.

However, conventional mechanical and laser cutting methods are not well suited for scribing many advanced finished wafers with, for example, low-k dielectric materials.

Relatively low density, lack of mechanical strength and sensitivity to thermal stress make low-k dielectric material very prone to damage. Conventional mechanical wafer dicing and scribing techniques are known to cause chips, cracks and other types of defects in low-k materials, thus damaging the IC devices. To reduce these problems without affecting dies and in view of the trends described above, a novel design of test line may be needed to meet the test needs for advanced semiconductor devices and complex integrated circuits.

Before addressing illustrated embodiments specifically, advantageous features and certain aspects of the exemplary embodiments are discussed generally. General aspects of embodiments described herein include a probe pad, a test key and a single via string stacking to alleviate cracks or other defects appearing in the semiconductor device.

The present disclosure therefore provides a semiconductor device and a test line structure. The semiconductor device includes a semiconductive substrate, a dielectric stack over the semiconductive substrate, and a probe pad formed on a top of the dielectric stack. The semiconductor device further includes a test key embedded in the semiconductor device, and a single via string stacking extending along a direction from a level of the probe pad to the semiconductie substrate and electrically connecting the periphery of the probe pad to the test key.

Figure 2:
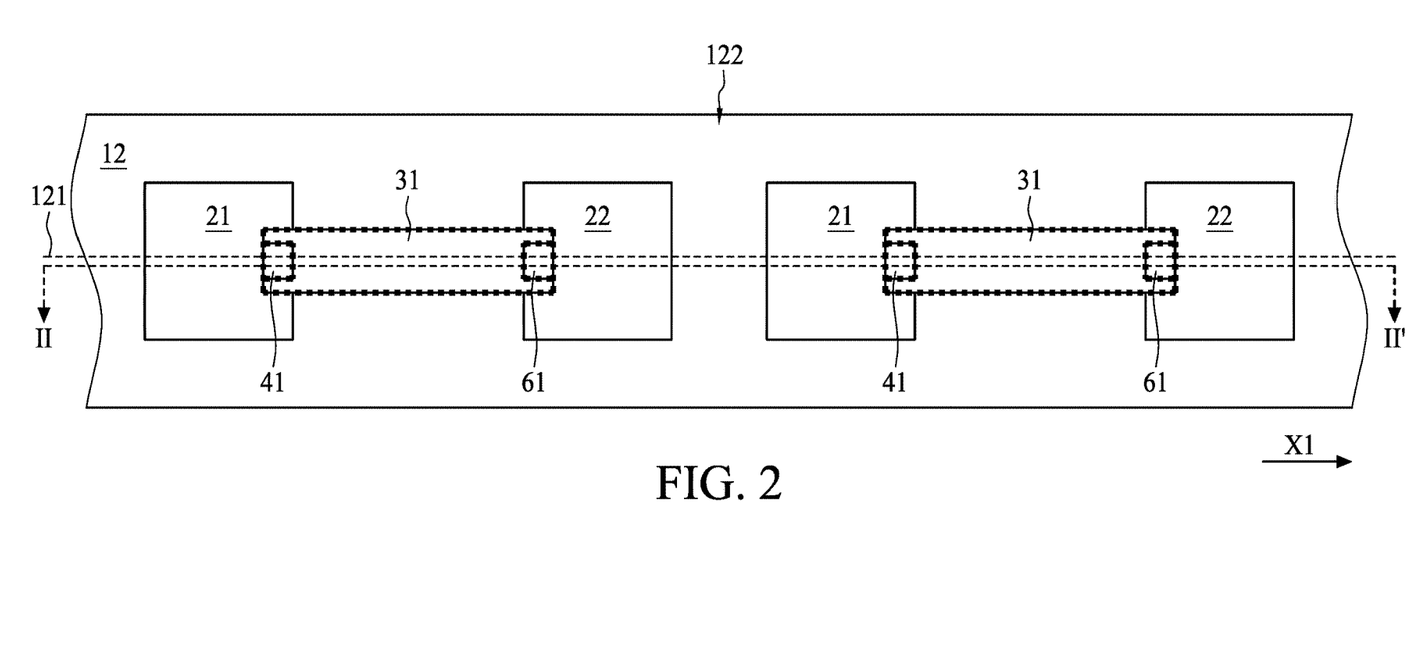
FIG. 2 is a schematic top view of a semiconductor device in accordance with some embodiments of the present disclosure.
Figure 3:
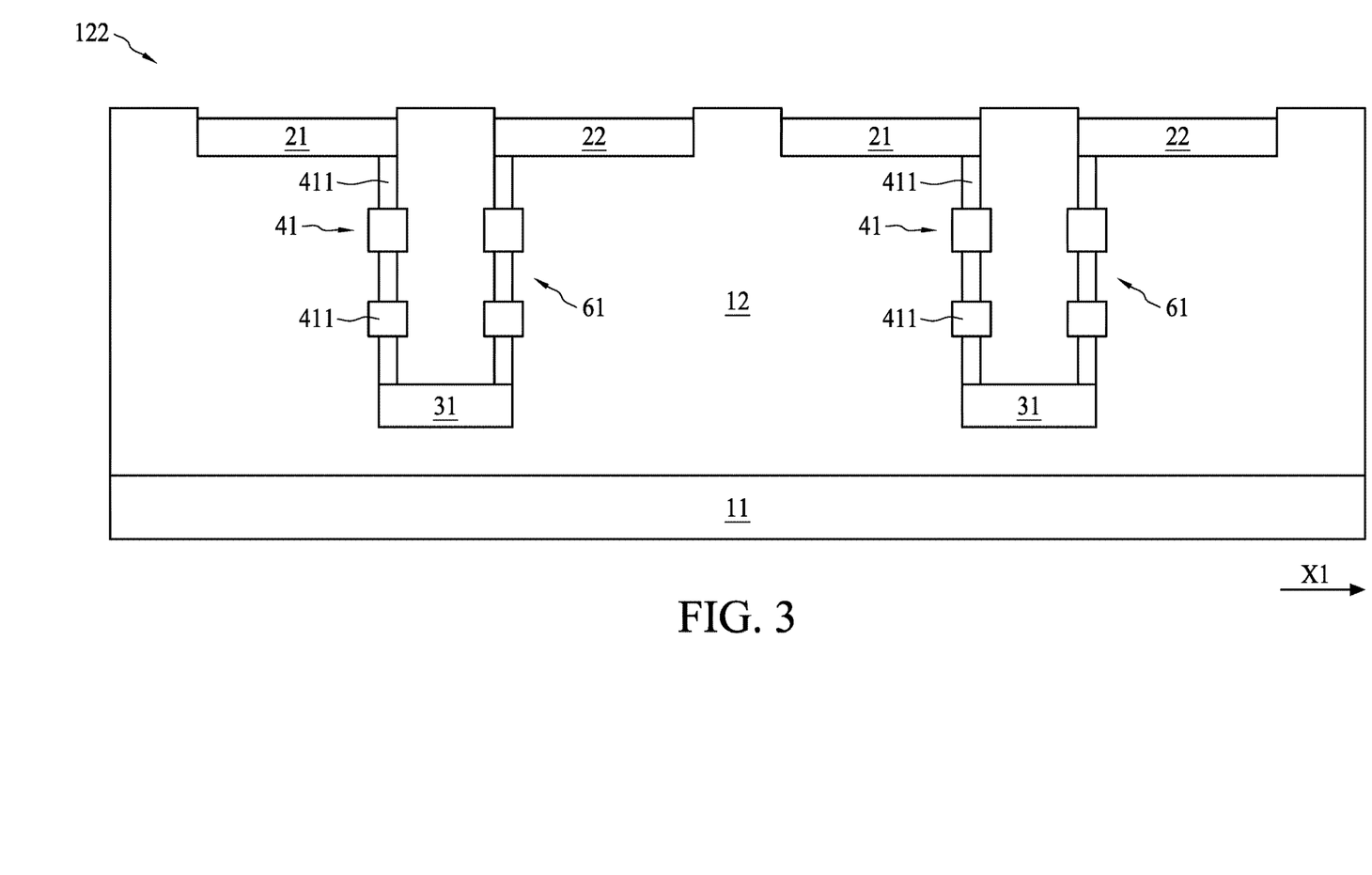
FIG. 3 is a cross-sectional view of a semiconductor device in accordance with some embodiments of the present disclosure.

FIG. 2 is a schematic top view illustrating a semiconductor device according to aspects of the present disclosure in some embodiments. FIG. 3 is a schematic cross-sectional view taken along a line II-II' in FIG. 2. Referring to FIGS. 2 and 3, a semiconductor device includes a semiconductive substrate 11, a dielectric stack 12 over the semiconductive substrate 11, and a first probe pad 21 and a second probe pad 22 formed on a top of the dielectric stack 12. The semiconductor device further includes a test key 31 embedded in the semiconductor device, a first single via string stacking 41 along a direction extending from a level of the first probe pad 21 to the semiconductive substrate 11 and electrically connecting the periphery of the first probe pad 21 to the test key 31, and a second single via string stacking 61 along a direction extending from a level of the second probe pad 22 to the semiconductive substrate 11 and electrically connecting the periphery of the second probe pad 22 to the test key 31. In some embodiments, the semiconductor device is a test line structure.

In some embodiments, the semiconductive substrate 11 includes polysilicon, silane ($SiH_4$), di-silane ($Si_2H_6$), or di-clorsilane ($SiCl_2H_4$), silicon germanium, gallium arsenic, or other suitable semiconductor materials so as to function as a conductive material under certain conditions. In some embodiments, the semiconductive substrate 11 further includes doped regions, such as a P-well, an N-well, and/or a doped active region such as a P+ doped active region. In some embodiments, the semiconductive substrate 11 may further include other features such as a buried layer and/or an epitaxy layer. Furthermore, the semiconductive substrate 11 may be a semiconductor on insulator such as silicon on insulator (SOI). In some embodiments, the semiconductive substrate 11 may include a doped epitaxy layer, a gradient semiconductor layer, and/or a semiconductor layer overlying another semiconductor layer of a different type such as a silicon layer on a silicon germanium layer. In some embodiments, the semiconductive substrate 11 may include a multilayer silicon structure or a multilayer compound semiconductor configuration. In some embodiments, the semiconductive substrate 11 includes an inter-layer dielectric (ILD) layer. In some embodiments, the ILD layer may be a silicon oxide layer or any suitable ILD layer.

The dielectric stack 12 is disposed over the semiconductive substrate 11. In some embodiments, the dielectric stack 12 is disposed over the semiconductive substrate 11 so as to isolate the test key 31. In some embodiments, the dielectric stack 12 is a low-k dielectric stack. The dielectric constant (k value) of the low-k dielectric stack may be lower than 3.0, or lower than about 2.5, and the dielectric stack may therefore also be referred to as an extreme low-k (ELK) dielectric stack. The material for the dielectric stack 12 may include organic dielectric material such as organic silicate glass (OSG), porous methyl silsesquioxane (p-MSQ), hydrogen silsesquioxane (HSQ), a combination thereof, or any other suitable organic low-k or extreme low-k material. In some embodiments, the material for the dielectric stack 12 may include inorganic dielectric material such as carbon-doped silicon oxide, fluorine-doped silicate glass (FSG), a combination thereof, or any other suitable inorganic low-k or extreme low-k material. In some other embodiments, other suitable dielectric materials, such as silicon oxide or phosphosilicate glass (PSG), may also be used. In some embodiments, the dielectric stack 12 is made from dielectric materials selected from a group comprising silicon dioxide ($SiO2$), silicon carbide (SiC), silicon nitride ($Si_3N_4$), and the combinations thereof. In some embodiments, the dielectric stack 12 is arranged in a rectangle as seen from a top view, but the disclosure is not limited thereto.

In some embodiments, the dielectric stack 12 includes a plurality of sublayers (not shown). In some embodiments, the dielectric material included in different sublayers may be the same or different.

The first probe pad 21 and the second probe pad 22 are formed on a top of the dielectric stack 12. In some embodiments, the first probe pad 21 and the second probe pad 22 of the test line structures are configured to electrically connect to an external circuit or probes of a probe card to check the quality of the integrated circuit, as part of the wafer acceptance test. In some embodiments, the first probe pad 21 and the second probe pad 22 of the test line structures are configured to apply test stimuli to a corresponding test key 31. In some embodiments, the first probe pad 21 and the second probe pad 22 are formed on a scribe line 121. In some embodiments, the first probe pad 21 and the second probe pad 22 are formed in a test line area 122 arranged between dies on a semiconductor wafer. The test line area 122 is removed during dicing of the semiconductive substrate 11 to singulate the dies.

In some embodiments, each of the first probe pad 21 and the second probe pad 22 includes conductive material such as gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof. In some embodiments, the material included in the first probe pad 21 and the second probe pad 22 may be the same or different.

In some embodiments, the first probe pad 21 and the second probe pad 22 have a square shape from a top view. The first probe pad 21 and the second probe pad 22 can be, but are not limited to, round, oval, rectangular, square or other desired shape. In some embodiments, the opposing edges of each of the first probe pad 21 and the second probe pad 22 are either parallel or perpendicular to the longitudinal edges of the scribe line 121. In some embodiments, the first probe pad 21 and the second probe pad 22 may be rotated such that the opposing edges thereof are not aligned with the longitudinal edges of a scribe line 121.

FIGS. 2 and 3 illustrate only the first probe pad 21 and the second probe pad 22 for clarity and simplicity, but such example is intended to be illustrative only, and is not intended to be limiting to the embodiments. A person ordinarily skilled in the art would readily understand that any suitable number of the probe pads 21, 22 may alternatively be utilized, and all such combinations are fully intended to be included within the scope of the embodiments. Additionally, while the first probe pad 21 and the second probe pad 22 are illustrated as having similar features, this is intended to be illustrative and is not intended to limit the embodiments, as the first probe pad 21 and the second probe pad 22 may have similar structures or different structures in order to meet the desired functional capabilities.

The test key 31 is designed to monitor different process parameters or to evaluate different device structures and circuit products of the wafer. In practice, a layout of a generic framework testline structure is first provided to a testline designer. The testline designer will then customize the generic framework structure by plugging customized test keys into the predefined framework, using the predetermined size of a test line area 122 as a physical constraint.

In some embodiments, the test key 31 is selected from a group consisting of MOS devices, field MOS devices, diode devices, capacitors, resistors, inductors, contact/via chains, gate/field dielectric integrity devices, reliability devices, memory devices, user designed application-specific circuit structures, and the like. In some embodiments, the test key 31 may be a device similar to a device formed in a die. In some embodiments, the test key 31 is disposed in the dielectric stack 12, and a distance from the test key 31 to the semiconductive substrate 11 is less than the distance from the first or second probe pads 21, 22 to the semiconductive substrate 11. In some embodiments, the test key 31 is disposed in the semiconductive substrate 11. In some embodiments, the semiconductor device includes a plurality of test keys 31, and each test key 31 is electrically connected to the corresponding probe pads 21, 22.

In some embodiments, the test key 31 is located between a side of the first probe pad 21 away from the second probe pad 22 and a side of the second probe pad 22 away from the first probe pad 21 from a top view. In some embodiments, the test key 31 may overlap the first probe pad 21 and/or the second probe pad 22 from a top view.

In some embodiments, the test keys 31 typically are formed in the test line area 122, and are electrically coupled to the corresponding probe pad 21, 22 through the first or second single via string stackings 41, 61. In some embodiments, the wafer acceptance test method includes providing several test keys 31 distributed in a periphery region of a die, which is desired to be tested. A module of the test keys is selected and each test key of the selected module is respectively used for a test of a different property of the wafer, such as threshold voltage ($V_{TH}$) or saturate current ($I_{DSAT}$).

The single via string stacking is configured to electrically connect the test key to the corresponding probe pads. In some embodiments, the first single via string stacking 41 is configured to electrically connect the test key 31 to the first probe pad 21, and the second single via string stacking 61 is configured to electrically connect the test key 31 to the second probe pad 22. In some embodiments, each of the first single via string stacking 41 and the second single via string stacking 61 extends along a direction from a level of the first or second probe pad 21, 22 to the semiconductive substrate 11.

In some embodiments, each of the first probe pad 21 and the second probe pad 22 includes a periphery and a central portion surrounded by the periphery, each of the first and second single via string stackings 41, 61 connects the periphery of the corresponding probe pads 21, 22 to the test key 31, and the dielectric stack 12 is disposed between the semiconductive substrate 11 and the central portion of the first and second probe pads 21, 22. In some embodiments, the first probe pad 21 and the second probe pad 22 respectively overlap the first and second single via string stackings 41, 61 from a top view.

In some embodiments, each probe pad 21, 22 includes a periphery and a central portion surrounded by the periphery, and the dielectric stack 12 is disposed between the semiconductive substrate 11 and the central portions of the probe pads 21, 22. That is, only the first and second single via string stackings 41, 61 and the dielectric stack 12 are disposed in the space between the corresponding first and second probe pads 21, 22 and the semiconductive substrate 11. As such, development of a crack can be minimized or prevented, and reliability of the semiconductor device is improved. In some embodiments, it is desired that the first single via string stacking 41 and the second single via string stacking 61 be of the proper width to insure reliability of the semiconductor device. In some embodiments, the maximum width of each of the first and second probe pads 21, 22 along a first direction X1 is more than 10 times the maximum width of the corresponding first and second single via string stackings 41, 61 along the first direction, but the disclosure is not limited thereto.

In some embodiments, a plurality of the first second single via string stackings 41 and a plurality of the second single via string stackings 61 connect the corresponding probe pads 21, 22 to the test key 31. In some embodiments, the plurality of the first and second single via string stackings 41, 61 and the dielectric stack 12 are disposed in the space between the corresponding first and second probe pads 21, 22 and the semiconductive substrate 11. In some embodiments, the first probe pad 21 and the second probe pad 22 respectively overlap the plurality of the first and second single via string stackings 41, 61 from a top view.

In some embodiments, each of the first single via string stacking 41 and the second single via string stacking 61 includes conductive material such as gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof. In some embodiments, the material included in the first single via string stacking 41 and the second single via string stacking 61 may be the same or different. In some embodiments, the material included in the first and second probe pads 21, 22 and the first and second single via string stackings 41, 61 may be the same or different.

In some embodiments, the length of each of the first single via string stacking 41 and the second single via string stacking 61 is adjusted with the position of the test key 31 and the thickness of the dielectric stack 12. In some embodiments, each of the first single via string stacking 41 and the second single via string stacking 61 includes a plurality of single vias 411, 611. That is, each of the first single via string stacking 41 and the second single via string stacking 61 is a via stack formed by a plurality of single vias 411, 611. In some embodiments, the conductive material included in each of the plurality of single vias 411, 611 may be the same or different.

In some embodiments, the single vias 411, 611 of the first single via string stacking 41 and the second single via string stacking 61 are embedded in one or more sublayers of the dielectric stack 12. For each of the single vias 411, 611, a sublayer of the dielectric stack 12 is etched with a pattern, a conductive material is deposited over the sublayer, and a top portion of the deposited conductive material is removed by a chemical mechanical planarization (CMP) process. The overall process can be used to make the single vias 411, 611, while a dual damascene process can be used to make other interlayer connections.

While the first single via string stacking 41 and the second single via string stacking 61 are described as having similar features, such description is intended to be illustrative and is not intended to limit the embodiments, as the first single via string stacking 41 and the second single via string stacking 61 may have similar structures or different structures in order to meet the desired functional requirements.

Figure 4:
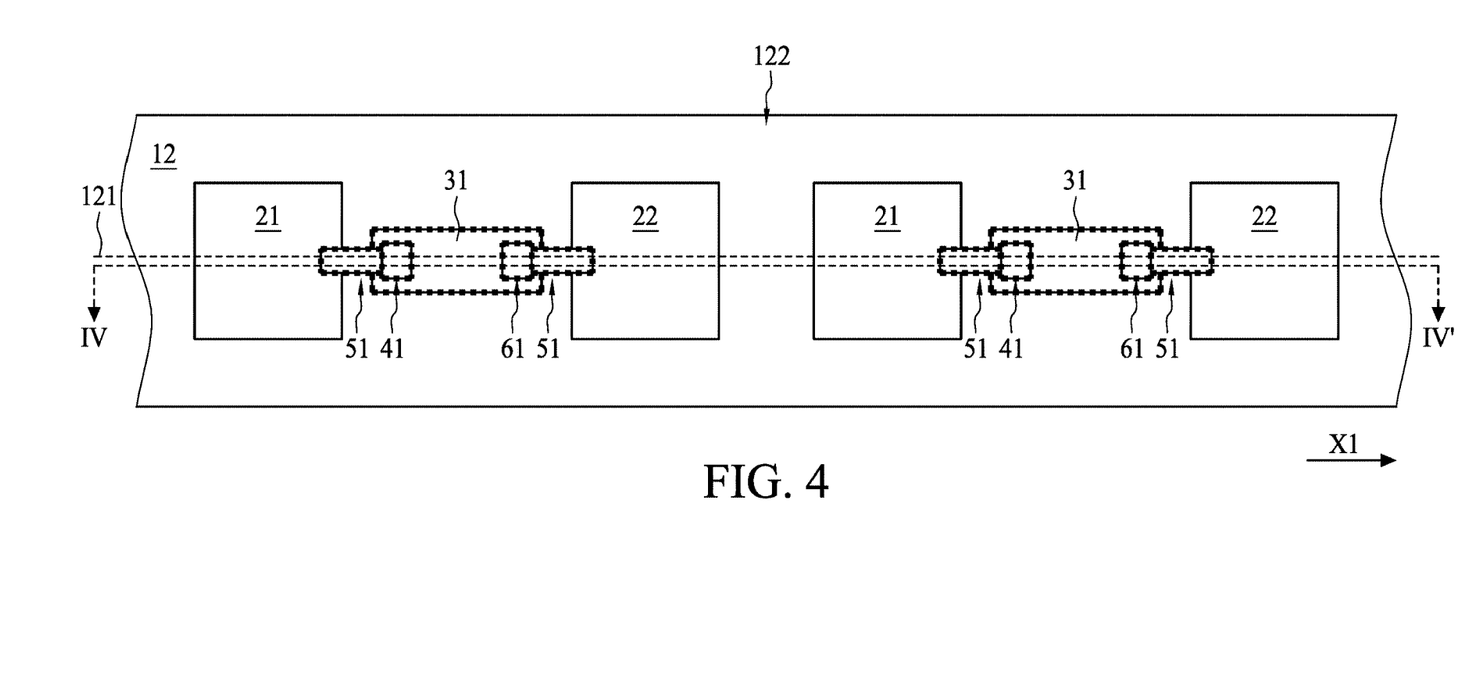
FIG. 4 is a schematic top view of a semiconductor device in accordance with some embodiments of the present disclosure.
Figure 5:
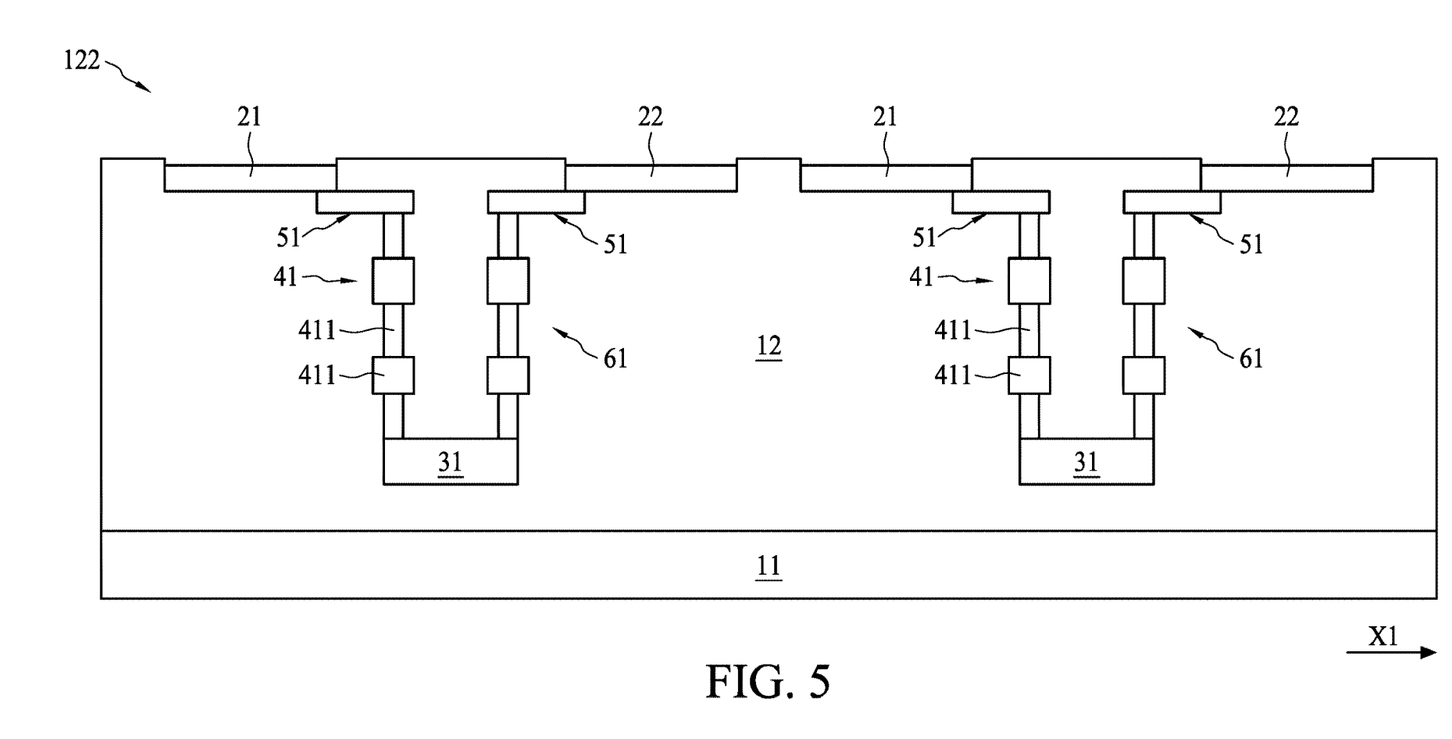
FIG. 5 is a cross-sectional view of a semiconductor device in accordance with some embodiments of the present disclosure.

FIG. 4 is a schematic top view illustrating a semiconductor device according to aspects of the present disclosure in some embodiments, and FIG. 5 is a schematic cross-sectional view taken along a line IV-IV' in FIG. 4. Referring to FIGS. 4 and 5, a semiconductor device includes a semiconductive substrate 11, a dielectric stack 12 over the semiconductive substrate 11, and a first probe pad 21 and a second probe pad 22 formed on a top of the dielectric stack 12. The semiconductor device further includes a test key 31 embedded in the semiconductor device, an extension segment 51 electrically connected to the periphery of each of the first and second probe pads 21, 22 and laterally extending from the first or second probe pads 21, 22 from a top view, and first and second single via string stackings 41, 61 extending along a direction from a level of the probe pads 41, 61 to the semiconductive substrate 11 and electrically connecting the corresponding extension segments 51 to the test key 31. The first single via string stacking 41 and the first probe pad 21 are laterally offset from a top view. The second single via string stacking 61 and the second probe pad 22 are laterally offset from a top view. In some embodiments, the semiconductor device is a test line structure.

In some embodiments, the extension segment 51 extends from the first or second probe pads 21, 22 along the level of the probe pad s 21, 22 from a top view. In some embodiments, the extension segment 51 extends along the direction X1. In some embodiments, the direction in which the extension segment 51 extends is perpendicular to the direction in which the first or second single via string stackings 41, 61 extend.

In some embodiments, the extension segments 51 are electrically connected to the periphery of each first and second probe pad 21, 22. In some embodiments, taking the first probe pad 21 and the first single via string stacking 41 as an example, one end of the extension segment 51 is electrically connected to the first probe pad 21, and another end of the extension segment 51 is electrically connected to the first single via string stacking 41. In some embodiments, the extension segment 51 is arranged in a long strip, a rectangle, or a square as seen from a top view, but the disclosure is not limited thereto. In some embodiments, the dielectric stack 12 is disposed between the semiconductive substrate 11 and the first and second probe pads 21, 22. That is, only the dielectric stack 12 is disposed in the spaces between the first and second probe pads 21, 22 and the semiconductive substrate 11, and the first and second single via string stackings 41, 61 are located below the corresponding extension segment 51 from a top view. As such, development of a crack can be minimized or prevented, and reliability of the semiconductor device is improved. In some embodiments, it is desired that the extension segment 51 to be of the proper width and length to insure reliability of the semiconductor device.

In some embodiments, the extension segment 51 includes conductive material such as gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof. In some embodiments, the material included in the first single via string stacking 41 and the second single via string stacking 61 may be similar to or different from the material included in the extension segment 51. In some embodiments, the material included in the first probe pad 21 and the second probe pad 22 may be similar to or different from the material included in the extension segment 51.

Figure 6:
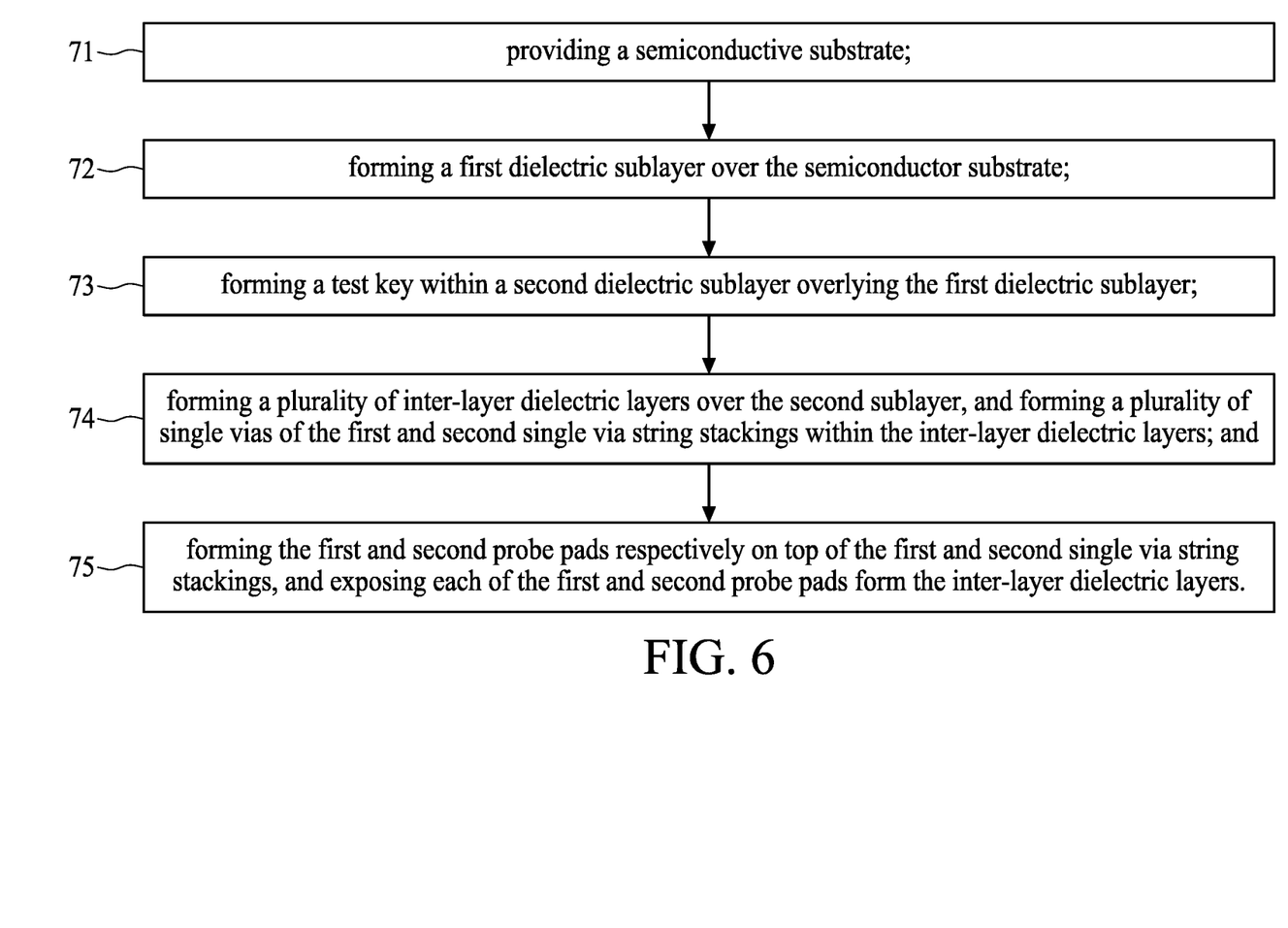
FIG. 6 is a flowchart representing a method of manufacturing a semiconductor device according to aspects of the present disclosure in one or more embodiments.

In some embodiments, a method of manufacturing a semiconductor device is disclosed. The method includes a number of operations and the description and illustration are not deemed as a limitation of the sequence of the operations. FIG. 6 is a flowchart depicting an embodiment of the method of manufacturing the semiconductor device. The method includes operations 71, 72, 73, 74 and 75. In some embodiments, the operations 71, 72, 73, 74 and 75 may be used to provide or manufacture the semiconductor device similar to the semiconductor device illustrated in FIGS. 2 and 3.

In operation 71, a semiconductive substrate 11 is provided. The semiconductive substrate 11 may be patterned using photolithography techniques.

In operation 72, a first dielectric sublayer is formed over the semiconductor substrate 11. In some embodiments, the first dielectric sublayer may comprise a low-k dielectric material, formed by way of a deposition process (e.g., CVD, PVD, etc.). A planarization process may be subsequently performed.

Figure 7:
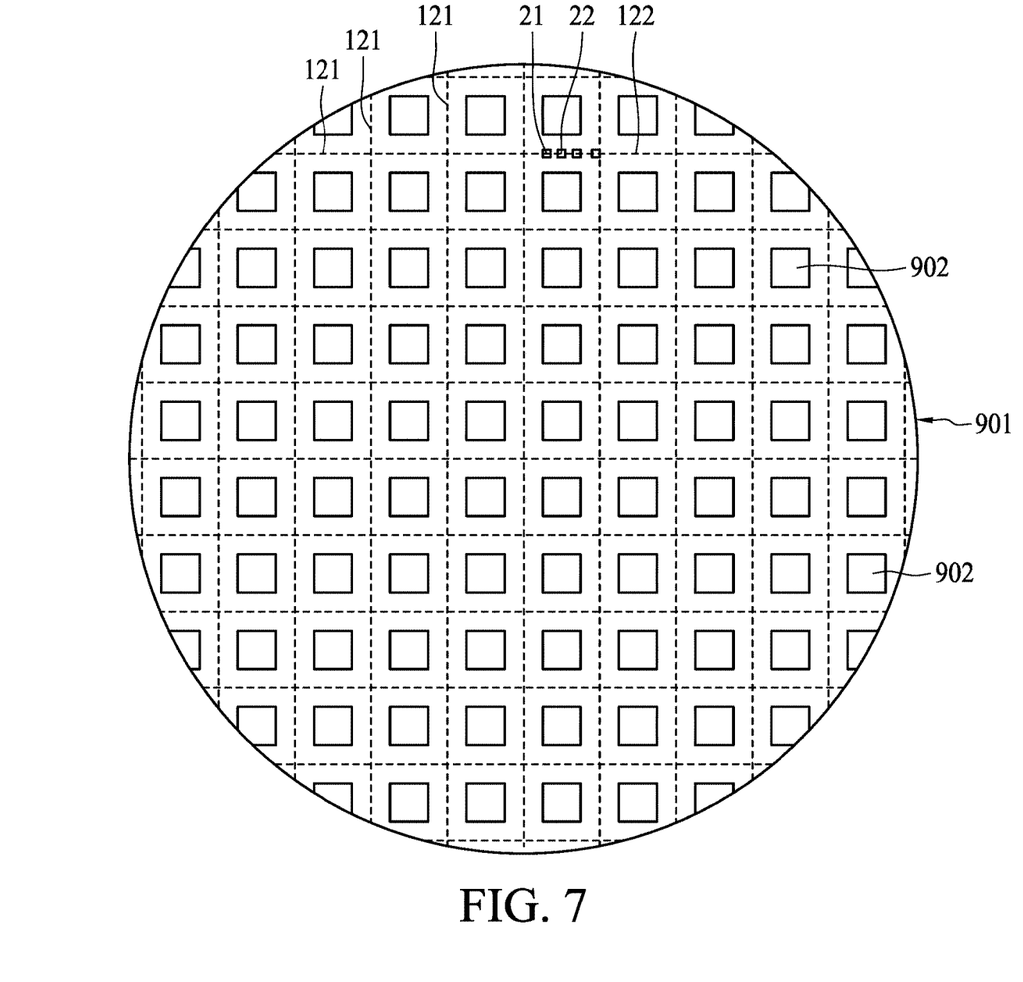
FIG. 7 is a schematic view illustrating a wafer including a semiconductor device according to aspects of the present disclosure in one or more embodiments.

In operation 73, the test key 31 is formed within a second dielectric sublayer overlying the first dielectric sublayer. In some embodiments, the second dielectric sublayer may comprise a low-k dielectric material, formed by way of a deposition process (e.g., CVD, PVD, etc.). A planarization process may be subsequently performed. FIG. 7 is a schematic view illustrating a wafer 901 including the semiconductor device manufactured by the method of the present disclosure. In some embodiments, as shown in FIG. 7, several dies 902 are formed on a wafer 901 with a matrix distribution. A plurality of test line area 122 are formed between dies 902 and defined by a plurality of scribe lines 121. In each of the dies 102, an actual device is formed. In some embodiments, as shown in FIG. 7, the test key 31 is formed in a test line area 122 between dies 902, and the test key 31 is formed simultaneously with the similar actual device of the dies 902.

In operation 74, a plurality of inter-layer dielectric layers are formed over the second sublayer, and a plurality of single vias 411, 611 of the first and second single via string stackings 41, 61 are formed within the inter-layer dielectric layers. In some embodiments, the inter-layer dielectric layers may comprise a low-k dielectric material. In some embodiments. In some embodiments, the single vias 411, 611 may be formed by selectively etching the inter-layer dielectric layers to form openings, and by subsequently depositing a conductive material within the openings. In some embodiments, as shown in FIG. 7, the single vias 411, 611 are formed in the test line area 122 between dies 902, and the single vias 411, 611 are formed simultaneously with the metal layers or interconnect structure of the dies 102. In some embodiments, the single vias 411 are electrically connected to each other and form the first single via string stacking 41, and the single vias 611 are electrically connected to each other and form the second single via string stacking 61.

In operation 75, the first and second probe pads 21, 22 are respectively formed on top of the first and second single via string stackings 41, 61, and each of the first and second probe pads 21, 22 are exposed form the inter-layer dielectric layers as shown in FIG. 7.

Figure 8:
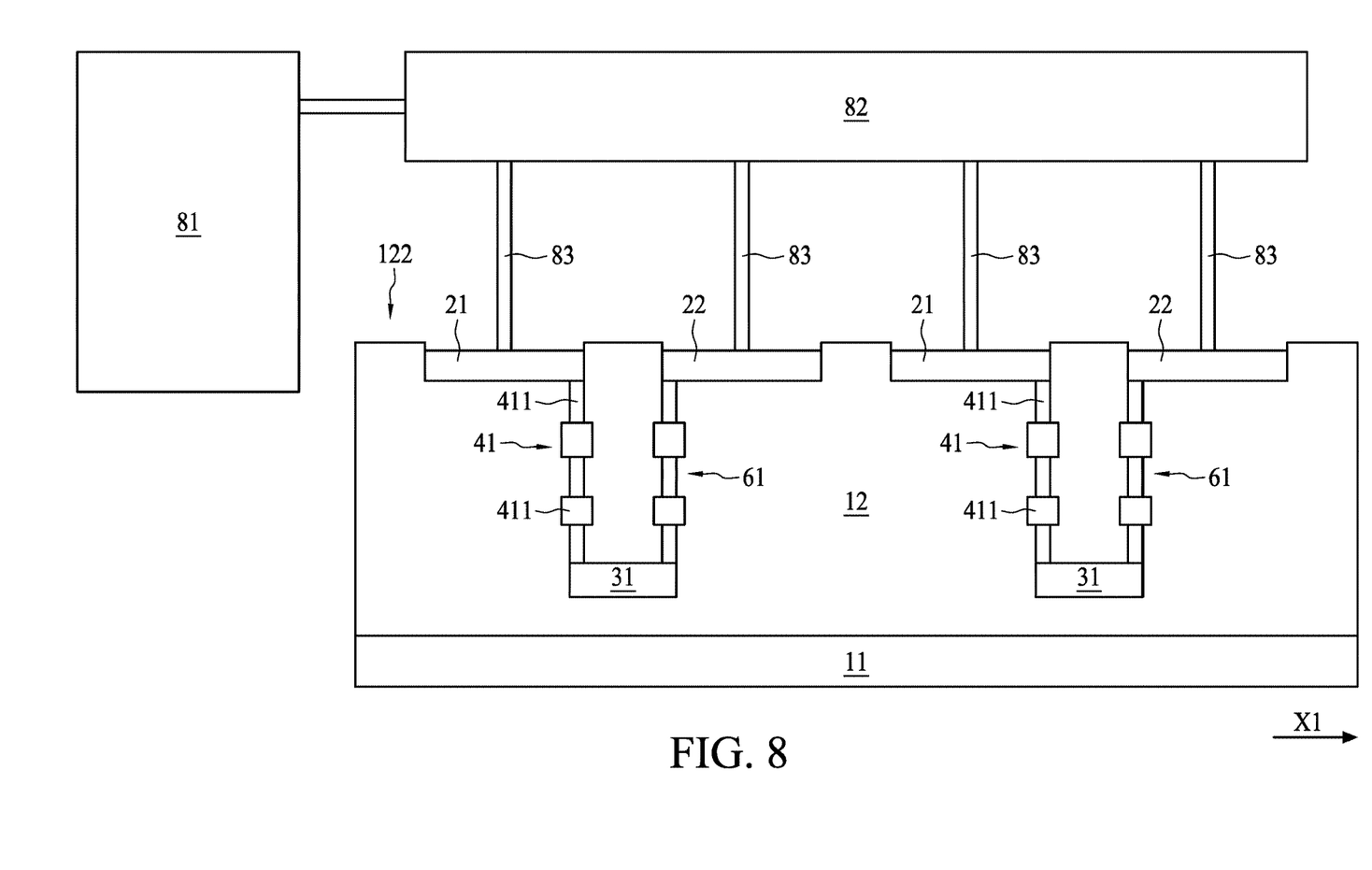
FIG. 8 is a schematic view illustrating a wafer acceptance test for a semiconductor device according to aspects of the present disclosure in one or more embodiments.

In some embodiments, a method for performing a wafer acceptance test, in accordance with some embodiments of the disclosure is disclosed FIG. 8 is a schematic view illustrating a wafer acceptance test for a semiconductor device, in accordance with some embodiments of the disclosure In some embodiments, as shown in FIG. 8 the method includes providing a testing signal to the first probe pad 21 by a testing apparatus 81 via the probes 83 of a probe card 82, and detecting a response signal at the second probe pad 22. Therefore, according to the response signal, the semiconductor device can determine whether the test key 31 under test is normal. In some embodiments, the information of the response signal is analyzed, so as to analyze the manufacturing process of the wafer 101.

Referring back to FIG. 7, in some embodiments, after analysis the information of the response signal, a wafer including the semiconductor device of the present disclosure may be scribe along the scribe lines to separate the dies 902 from one another by mechanical or laser cutting methods. In some embodiments, the test line areas 122 including the semiconductor device of the present disclosure may be removed.

Accordingly, the present disclosure therefore provides a semiconductor device and a test line structure. The semiconductor device includes a semiconductive substrate, a dielectric stack, a probe pad, a test key and a single via string stacking. The dielectric stack is formed over the semiconductive substrate. The probe pad is formed on a top of the dielectric stack. The test key is embedded in the semiconductor device. The single via string stacking extends along a direction from a level of the probe pad to the semiconductive substrate and electrically connects the periphery of the probe pad to the test key. Consequently, when the semiconductor device is scribed by laser, the semiconductor device is not susceptible to cracking.

Some embodiments of the present disclosure provide a semiconductor device including a semiconductive substrate, a dielectric stack over the semiconductive substrate, and a probe pad formed on a top of the dielectric stack. The semiconductor device further includes a test key embedded in the semiconductor device, and a single via string stacking extending along a direction from a level of the probe pad to the semiconductive substrate and electrically connecting the periphery of the probe pad to the test key.

Some embodiments of the present disclosure provide a semiconductor device including a semiconductive substrate, a dielectric stack over the semiconductive substrate, and a probe pad formed on a top of the dielectric stack. The semiconductor device further includes a test key embedded in the semiconductor device, an extension segment electrically connected to the periphery of the probe pad and laterally extending from the probe pad from a top view, and a single via string stacking extending along a direction from a level of the probe pad to the semiconductive substrate and electrically connecting the extension segment to the test key. The single via string stacking and the probe pad are laterally offset from a top view.

Some embodiments of the present disclosure provide a test line structure in a semiconductor device including a semiconductive substrate, a dielectric stack over the semiconductive substrate, and a first probe pad and a second probe pad formed on a top of the dielectric stack. The semiconductor device further includes a test key embedded in the semiconductor device, wherein the test key is located between a side of the first probe pad away from the second probe pad and a side of the second probe pad away from the first probe pad from a top view. The semiconductor device further includes a first single via string stacking and a second single via string stacking electrically connected to the periphery of the first probe pad and the second probe pad, respectively, and respectively coupling the test key to the first probe pad and the second probe pad, wherein each of the first single via string stacking and the second single via string stacking respectively extends along a direction from a level of the first and second probe pads to the semiconductive substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductive substrate;
   a dielectric stack over the semiconductive substrate;
   a probe pad formed on a top of the dielectric stack;
   a test key embedded in the semiconductor device;
   an extension segment electrically connected to a periphery of the probe pad and laterally extending from the probe pad from a top view; and
   a single via string stacking extending along a direction from a level of the extension segment to the semiconductive substrate and electrically connecting the extension segment to the test key;
   wherein one end of the extension segment is connected to the probe pad, and connected to the single via string stacking at the other end, and the single via string stacking and the probe pad are laterally offset from a top view.

2. The semiconductor device of claim 1, wherein the probe pad is formed between two scribe lines.

3. The semiconductor device of claim 1, wherein the probe pad is formed in a test line area.

4. The semiconductor device of claim 1, wherein the single via string stacking is located below the extension segment from a top view.

5. The semiconductor device of claim 1, wherein the probe pad includes a periphery and a central portion surrounded by the periphery, and the dielectric stack is disposed between the semiconductive substrate and the central portion of the probe pad.

6. The semiconductor device of claim 1, wherein the single via string stacking includes a plurality of single vias extending along a direction from a level of the extension segment to the semiconductive substrate.

7. The semiconductor device of claim 1, wherein the dielectric stack is made from dielectric materials selected from a group comprising silicon dioxide (SiO2), silicon carbide (SiC), silicon nitride ($Si_3N_4$), and combinations thereof.

8. The semiconductor device of claim 1, wherein the test key is selected from a group consisting of MOS devices, field MOS devices, diode devices, capacitors, resistors, inductors, contact/via chains, gate/field dielectric integrity devices, reliability devices, memory devices, user designed, and application-specific circuit structures.

9. The semiconductor device of claim 1, wherein the single via string stacking includes gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof.

10. The semiconductor device of claim 1, wherein the test key is disposed in the dielectric stack.

11. The semiconductor device of claim 10, wherein the test key is formed over the semiconductive substrate, and the distance from the test key to the semiconductive substrate is less than the distance from the probe pad to the semiconductive substrate.

12. A semiconductor device, comprising:
    a semiconductive substrate;
    a dielectric stack over the semiconductive substrate;
    a probe pad formed on a top of the dielectric stack;
    a test key embedded in the semiconductor device;
    an extension segment electrically connected to the periphery of the probe pad and laterally extending from the probe pad from a top view; and
    a single via string stacking extending along a direction from a level of the probe pad to the semiconductive substrate and electrically connecting the extension segment to the test key;
    wherein the single via string stacking and the probe pad are laterally offset from a top view.

13. The semiconductor device of claim 12, wherein the dielectric stack is disposed between the semiconductive substrate and the probe pad.

14. The semiconductor device of claim 12, wherein the extension segment extends from the probe pad along a level of the probe pad from a top view.

15. The semiconductor device of claim 12, wherein the extension segment is embedded in the dielectric stack.

16. The semiconductor device of claim 12, wherein the single via string stacking includes a plurality of single vias extending along a direction from a level of the probe pad to the semiconductive substrate.

17. A test line structure, comprising:
    a semiconductive substrate;
    a dielectric stack over the semiconductive substrate;
    a first probe pad and a second probe pad formed on a top of the dielectric stack;
    a first extension segment electrically connected to a periphery of the first probe pad and laterally extending from the first probe pad from a top view;
    a second extension segment electrically connected to a periphery of the second probe pad and laterally extending from the second probe pad from a top view;
    a test key embedded in the semiconductor device, wherein the test key is located between a side of the first probe pad away from the second probe pad and a side of the second probe pad away from the first probe pad from a top view; and
    a first single via string stacking and a second single via string stacking electrically connected to the extension segment and the second extension segment, respectively, and coupling the test key to the first extension segment and the second extension segment, respectively, wherein each of the first single via string stacking and the second single via string stacking respectively extends along a direction from a level of the first and second extension segments to the semiconductive substrate;
    wherein one end of the first extension segment is connected to the first probe pad, and connected to the first single via string stacking at the other end; and
    wherein the first single via string stacking and the first probe pad are laterally offset from a top view.

18. The test line structure of claim 17, wherein the first and second extension segments are embedded in the dielectric stack.

19. The test line structure of claim 17, wherein one end of the second extension segment is connected to the periphery of the second probe pad, and connected to the second single via string stacking at the other end.

20. The test line structure of claim 17, wherein the first single via string stacking includes a plurality of single vias extending along a direction from a level of the first extension segment to the semiconductive substrate.

* * * * *